United States Patent [19]

Rapoport et al.

[11] Patent Number: 5,320,103
[45] Date of Patent: Jun. 14, 1994

[54] PERMANENT MAGNET ARRANGEMENT

[75] Inventors: Uri Rapoport, Oak Park; Richard Panosh, Lisle, both of Ill.

[73] Assignee: Advanced Techtronics, Inc., Chicago, Ill.

[21] Appl. No.: 775,840

[22] Filed: Oct. 15, 1991

Related U.S. Application Data

[63] Continuation of Ser. No. 277,209, Nov. 29, 1988, Pat. No. 5,063,934, which is a continuation-in-part of Ser. No. 106,114, Oct. 7, 1987, Pat. No. 4,998,976.

[51] Int. Cl.$^5$ .............................................. A61B 5/055
[52] U.S. Cl. .................... 128/653.5; 335/296; 335/300; 335/302; 324/318; 336/110
[58] Field of Search ................. 128/653.5; 335/296, 335/299, 300, 302; 324/319, 320, 318; 336/110

[56] References Cited

U.S. PATENT DOCUMENTS

| | | | |
|---|---|---|---|
| 3,059,156 | 10/1962 | Moriya | 336/110 |
| 3,992,689 | 11/1976 | Kaplow | 335/302 |
| 4,777,464 | 10/1988 | Takabatashi et al. | 324/318 |
| 4,827,235 | 5/1989 | Inomata et al. | 335/297 |

Primary Examiner—Lee S. Cohen
Assistant Examiner—Brian L. Casler
Attorney, Agent, or Firm—Jones, Day, Reavis & Pogue

[57] ABSTRACT

A permanent magnet assembly used for creating a uniform magnetic field across a portion of an air gap has a permanent magnet grouping, including a first, principal magnet, a pole piece contacting said principal magnet, and a set of auxiliary magnets extending about the periphery of the pole piece. Two such magnet groupings are positioned within a test chamber, separated a spacer, with the magnet groupings and the chamber defining the air gap across which the magnetic field extends. The strength and uniformity of the magnetic field is adjusted by including a second set of auxiliary permanent magnets or a set of electromagnetic shim coils positioned within the air gap surrounding and overtapping a portion of the air gap. Further adjustment of the magnetic field is accomplished shaping the front surfaces of the pole pieces, thus affecting the shape and direction of the resulting magnetic field.

15 Claims, 5 Drawing Sheets

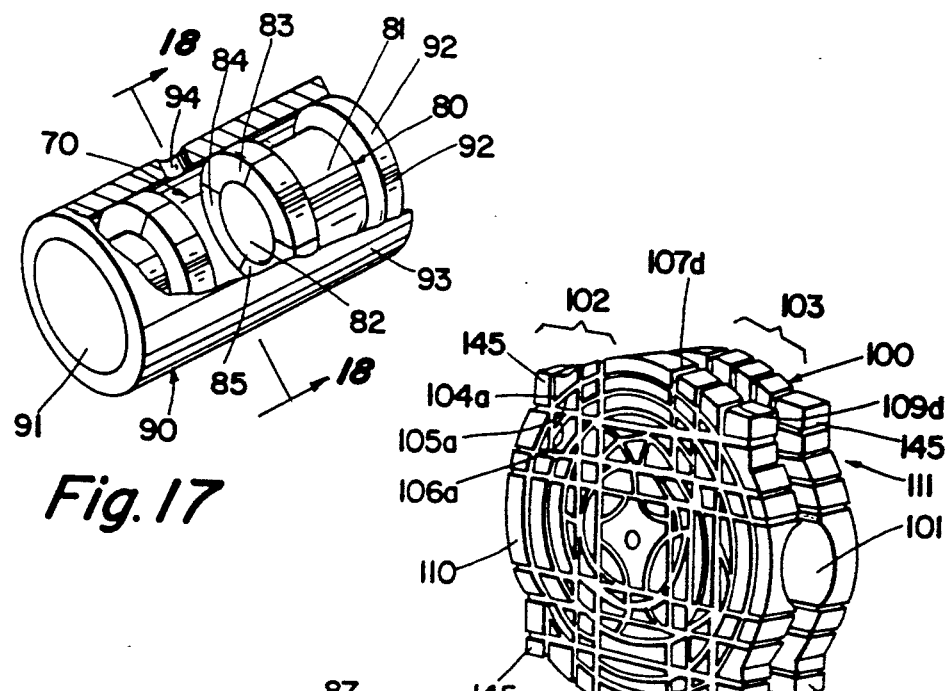
Fig. 17
Fig. 19
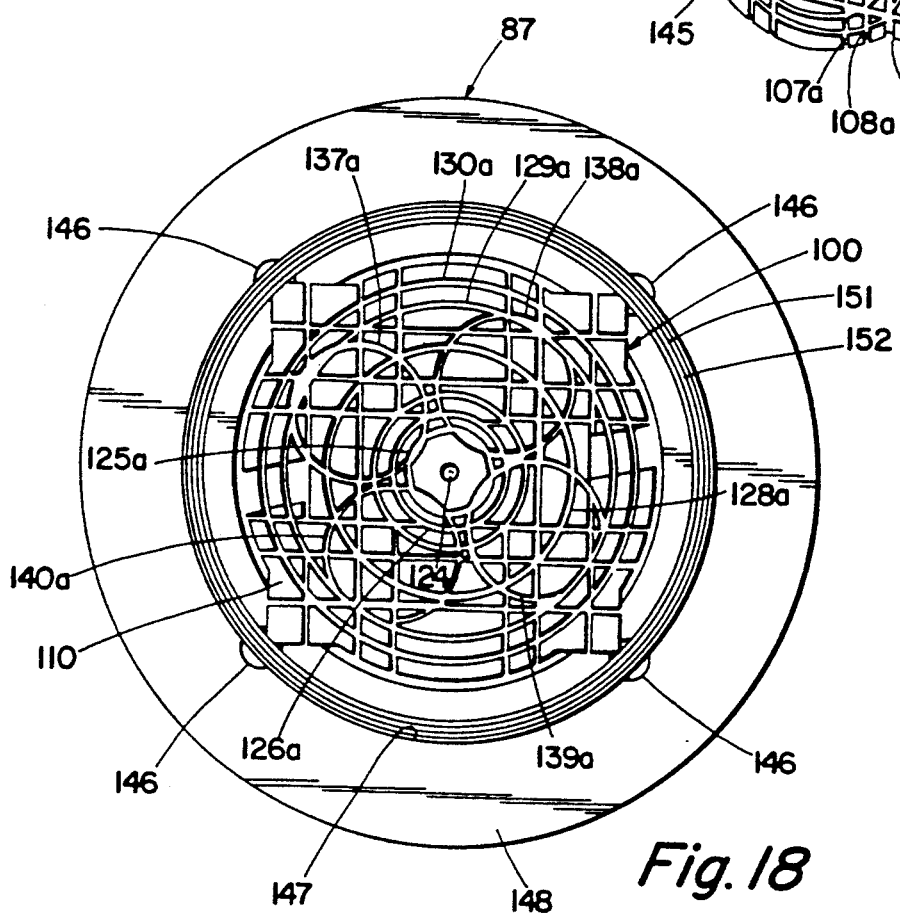
Fig. 18

PERMANENT MAGNET ARRANGEMENT

This is a continuation of application Ser. No. 277,209, filed Nov. 29, 1988, now U.S. Pat. No. 5,063,954, which in turn a continuation-in-part of Ser. No. 106,114 filed Oct. 7, 1987, now U.S. Pat. No. 4,998,976.

BACKGROUND OF THE INVENTION

This invention relates generally to permanent magnets and, more particularly, to configurations of permanent magnets used to produce a magnetic field having a required strength and flux alignment at a specified situs. This application is related to pending application Ser. No. 904,000 entitled "Instrument For Non-Invasive Testing For Glucose And Other Body Fluid Constituents", filed Sep. 4, 1986.

The use of permanent magnets to produce and maintain magnetic fields of predetermined characteristics has found wide-spread application throughout varied areas of technology. As one example, the use of permanent magnets in loudspeakers makes possible the accurate reproduction of sound and music.

Permanent magnets offer numerous advantages over electromagnets, the most prominent of which is the creation of a magnetic field without electrical energy, or an external power source. This is an important consideration in designing portable apparatus, and also results in constructions requiring little or no maintenance beyond initial assembly.

The present invention utilizes particular arrangements and configurations of permanent magnets to create strong, uniform magnetic fields. Although the uses to which the present invention may be put are described herein as principally in connection with medical diagnostic equipment, it should be understood that the invention may be utilized wherever a magnetic field is required.

The present application also discloses means and methods for adjusting and enhancing the magnetic fields produced by permanent magnets.

As described in the above-mentioned patent applications, the use of magnetic fields makes possible the non-invasive testing of human body systems to detect the presence of certain substances. In particular, permanent magnets are used to create a first, or biasing magnetic field to align initially randomly oriented $^1H$ protons present in the nuclei of the substance in the sample being tested. Thereafter, a second energy field is applied to increase the energy level of said nuclei. When the second energy field is allowed to collapse, the nuclei return to their original, unaligned state, releasing energy which is detected and analyzed in the form of an image or spectrum. Certain of such spectra have been found to be characteristic of individual substances, and this technique of nuclear magnetic resonance (NMR) spectroscopy may be used to establish the presence and identity of such substances and the concentrations in which such substances are present.

In utilizing NMR diagnostic techniques, creating and maintaining the primary or first magnetic field is of critical importance. The ability of the field to resolve the signal that occurs when the secondary field collapses can be characterized as the ratio of overall field strength to the field gradient present across the portion of the primary field within which the test sample is held. As an example, if the primary field strength is 10,000 gauss, and the change in field strength across the test region is 0.01 gauss, the field is said to have a resolution of 0.01/10,000, or one part per million (ppm).

Heretofore, the use of NMR has called for the construction of large, expensive machinery to produce and maintain the magnetic fields necessary for such testing. To make NMR equipment compact and portable, the primary magnetic field which is uniform in strength and direction, and which has a relatively dense magnetic flux, must be created by a relatively light and compact arrangement of magnets. Visually, such a field may be defined by the lines of flux which indicate not only the strength of the magnetic field, but its uniformity and orientation as well.

Ideally, the lines of magnetic flux should be parallel or nearly parallel and uniform in strength throughout i.e., that portion of the magnetic field used for diagnostic purposes (identified herein as the "test region"). It is efficacious to produce the first or primary magnetic field with permanent magnets rather than electromagnets.

The use of magnets and magnetic energy to diagnose and treat biological disfunctions is well known. As an example, in French Patent No. 2,562,785 (Jeandey, et al.) a permanent magnet system for NMR imaging medical diagnostics uses pole pieces separated by stacked permanent magnets to form an open examination area with the pole pieces "bridging" both stacks of magnets. Jeanday, et al. also teach the use of electromagnetic coils to adjust the resulting magnetic field.

Japanese Patent No. 56-14145 (Nippon Denshi K.K.) teaches an arrangement of permanent magnets held within a cylinder. A spacer is placed within the cylinder and sandwiched about the spacer are a pair of cylindrical pole pieces. The entire assembly is held together by placing magnets outside the pole pieces (separated from the pole pieces by a buffer) and utilizing the attraction of the magnets for each other to hold the entire assembly in place. Nippon Denshi also teaches the use of pole pieces having raised central portions, that is, flat faces which extend into the air gap between the pole pieces and from which the operative flux emanates. Nippon Denshi fails to teach any use of auxiliary magnets in combination with the principal magnets.

U.S. Pat. No. 4,635,643 (Brown) teaches the use of NMR equipment to perform in vivo measurement of the mineral content of bone. Brown, however, teaches no arrangement of permanent magnets in constructing a test chamber for NMR use.

In U.S. Pat. No. 4,134,395 (Davis) the patentee teaches the use of a permanent magnet to detect diseased body parts by observing the effect of a magnetic field on the muscles of the legs. Davis also describes the physical characteristics of a bar magnet showing the extent and shape of the magnetic field produced by such a magnet.

U.S. Pat. No. 3,467,076 (Frisch, et al,) discloses a magnet arrangement used to produce a field of high magnetic flux within which the effect of magnetic energy on living things may be observed. Frisch, et al., use a centrally-located electromagnet sandwiched between ferromagnetic pole pieces which extend beyond the edges of electromagnet to form an air gap within which the magnetic flux is produced.

In U.S. Pat. No. 3,358,676 (Frei, et al.), a method of treatment is taught which requires the use of an extremely large and cumbersome magnet structure. The size and complexity of magnets required to utilize the phenomenon of NMR in making diagnoses is also exemplified in an article appearing in the December, 1977 issue of *Popular Science* magazine, entitled "Damadian's Supermagnet". The author discusses the use of NMR to detect cancer cells: the size and strength of the magnetic field required to perform this diagnostic technique, and the size and complexity of the magnet used to produce such a field are well described.

BRIEF DESCRIPTION OF THE INVENTION

A relatively lightweight and compact grouping of permanent magnets creates a magnetic field of improved strength and uniformity. In one embodiment, two such magnet groupings are spaced apart to define an air gap in the space between them, within which a test region is established. The sample to be tested is placed within the test region. In using NMR medical diagnostic techniques for in vivo testing, the test sample may be a body part, such as a finger.

The permanent magnets create a field of sufficient strength and uniformity to allow the application of NMR principles to detect the presence of certain substances within the test sample. The entire magnet assembly may range in weight from about 6 to about 100 pounds and creates a magnetic field ranging in strength from about 0.5 tesla to about 2.0 tesla, as measured across a one inch air gap, with one tesla equal to 10,000 gauss.

The first and second groupings of magnets are assembled in a test chamber, within which the test sample is positioned. Each magnet grouping includes a first or principal magnet, a ferromagnetic pole piece in face-to-face contact with said principal magnet, and one or more auxiliary, or "side" magnets arranged about the outer periphery of the pole piece. The second grouping of magnets includes components identical to those in the first grouping and is placed within the test chamber opposite the first grouping. The polarity of the second grouping is opposite that of the first grouping, resulting in lines of magnetic flux extending between such groupings. Non-ferromagnetic spacers are used to prevent the first magnet grouping from being drawn into contact with the second magnet grouping, thereby creating the air gap across which the magnetic flux is directed and within which the test zone is created for the sample to be tested.

In another preferred embodiment of the invention, secondary auxiliary permanent magnets, or electromagnetic "shim" coils wrapped onto a non-ferromagnetic core placed within the test chamber are used to "fine-tune" the flux alignment across the air gap.

In yet another preferred embodiment of the invention, the pole pieces are specially configured to make the resulting magnetic field stronger and/or more uniform.

In a further preferred embodiment, no pole pieces are used, and the auxiliary magnets contact the principal magnet. The principal magnet may also be specially configured to adjust or modify the resulting magnetic field.

BRIEF DESCRIPTION OF THE DRAWINGS

These and further aspects of the present invention may best be understood by reference to the accompanying drawings, wherein:

FIG. 17 is a perspective view in partial section of cylindrical test chamber utilizing the magnet assembly of FIGS. 15 and 16;

FIG. 18 is a view of a spacer and core omitted from FIG. 17, with no shim coils wound onto the core;

FIG. 19 is a perspective view of the core of FIG. 18 upon which no shim coils are wound;

DETAILED DESCRIPTION OF THE DRAWINGS

Figure 1:
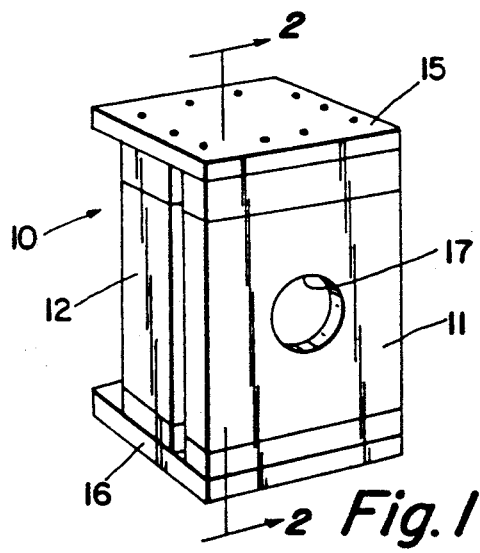
FIG. 1 is a perspective view of a test chamber constructed in accordance with the tea of the present invention; .
Figure 2:
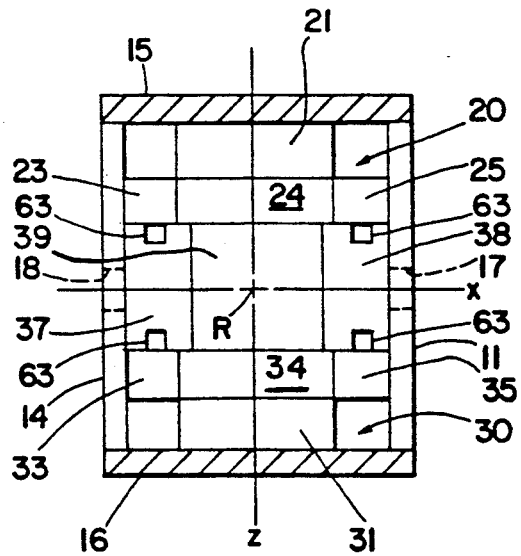
FIG. 2 is a view generally along line 2—2 of FIG. 1 inside of housing panel 12, and with the auxiliary side magnets engaging such panel being removed for clarity of illustration to show the pole pieces 22, 32 in FIG. 2.

Referring now to FIGS. 1 and 2, the numeral 10 indicates generally a preferred embodiment utilizing the present invention, namely, a test chamber into which a test sample is placed to be analyzed using NMR techniques and within which a first, or biasing magnetic field is present. For purposes of clarity, the components required to produce and collapse the second magnetic field, used in NMR analysis, and to detect the resulting signals from the test sample have been omitted.

Chamber 10 has a front panel 11, side panels 12 and 13 (not shown), a rear panel 14, and top and bottom panels 15 and 16 respectively. In the first preferred embodiment shown herein, chamber 10 is depicted as hollow and rectangular. Test apertures 17 and 18 are formed, respectively, centered on front and rear panels 11 and 14.

Figure 3:
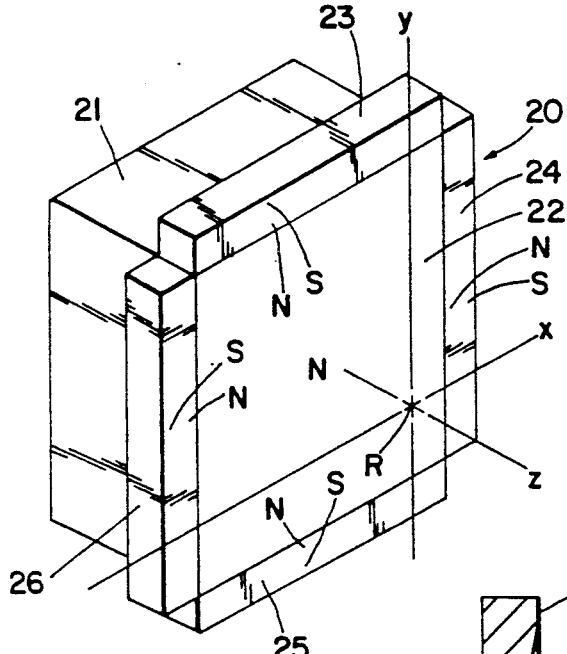
FIG. 3 is a partial perspective view illustrating the arrangement of one grouping of permanent magnets surrounding a pole piece.

Within chamber 10, there is disposed a pair of magnet groupings to be described in greater detail hereinafter. As best seen in FIG. 3, one such magnet grouping 20 preferably includes a principal permanent magnet 21 arranged in face-to-face contact with a ferromagnetic pole piece 22. The preferred embodiment of FIG. 3 further includes auxiliary, or "side" magnets, 23, 24, 25 and 26 arranged in edgewise fashion about the periphery of pole piece 22. In this preferred grouping, both principal magnet 21 and pole piece 22 are square, and auxiliary magnets 23, 24, 25 and 26 are bar magnets.

The second grouping 30 of permanent magnets, shown in FIG. 2, is identical to the grouping shown in FIG. 3, with a principal magnet 31 that cooperates with a pole piece corresponding to pole piece 22 of FIG. 3 but that is hidden from view in FIG. 2 behind side auxiliary magnet 34 (just as pole piece 22 of FIG. 3 is hidden from view in FIG. 2 behind side auxiliary magnet 24). Additional side auxiliary magnets 33 and 35 are shown in FIG. 2, and there is another unshown side auxiliary magnet opposite from side auxiliary magnet 34. As shown in FIG. 2, non-ferromagnetic spacers 37 and 38 are used to separate the first and second magnet groupings, physically preventing the groupings from drawing together, thereby creating and defining an air gap or cavity 39 across which lines of magnetic flux extend from one pole piece 22 to the other. Materials used successfully for the spacers are brass or phenolic plastics; other rigid non-ferromagnetic substances may also be used.

The individual panels of test chamber 10 are formed of a ferromagnetic material such as carbon steel or pure iron to provide a complete path or circuit for the magnetic energy generated by magnet groupings 20 and 30 throughout the entire chamber.

As seen in FIG. 3, a preferred arrangement of permanent magnets in each grouping has a pole piece with a north polar face, and side auxiliary magnets, each having a north polar face in direct contact with pole piece 22 and a south polar face facing away from pole piece 22. It is understood that the polarity referred to here is for purposes of convenience only in that the same pole on each auxiliary magnet is intended to be facing inwardly, corresponding to the pole effectively present on the air gap face of the pole piece.

Magnet grouping 30 has a polarity configuration opposite that of magnet grouping 20, i.e., the face of pole piece 22 has an opposite polarity than the face of the pole piece 32 in magnet grouping 30.

It has been found that the basic characteristics of magnetic field strength and field uniformity in the foregoing configurations are affected, inter alia by three variables: the size of the permanent magnet, the shape of the pole piece and the material from which the pole piece is made.

Referring now to FIGS. 4, 5, 6, 7 and 8, various shapes of pole pieces such as 22 are therein depicted. As seen in FIG. 3, a first preferred embodiment of pole piece 22 is that of a solid rectangular parallelepiped having planar front and rear faces. For reasons that will be set forth more fully hereinbelow, other pole piece configurations have been found to offer certain advantages.

Figure 4:
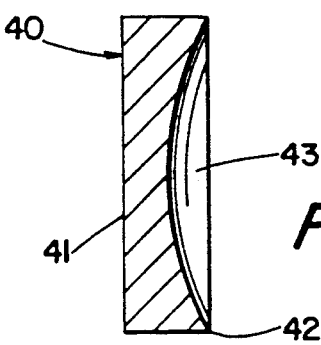
FIG. 4 is a lateral sectional view of one embodiment of a pole piece.

Referring now to FIG. 4, there is shown in sectional view, a second preferred pole piece 40 having a flat planar rear face 41 and a front face 42 having a spherical hollow 43 formed therein.

Figures 5, 6:
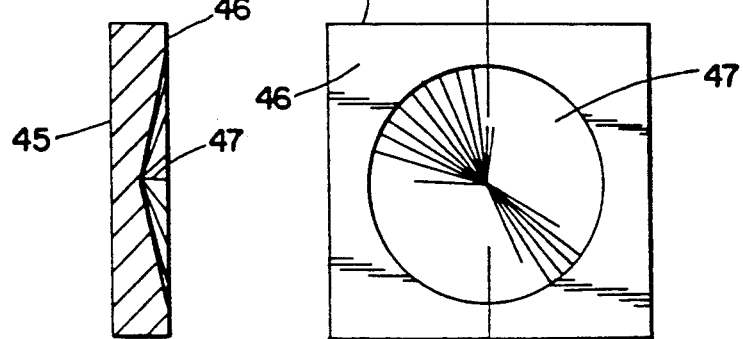
FIG. 5 is a front elevation of a second embodiment of a pole piece.
FIG. 6 is a lateral sectional view taken along line 5—5 of the pole piece shown in FIG. 5.

FIGS. 5 and 6 show, respectively, front and side sectional views of a third preferred pole piece 44 having a planar rear face 45 and a front face 46 within which a conical hollow 47 is formed.

Figures 7, 8:
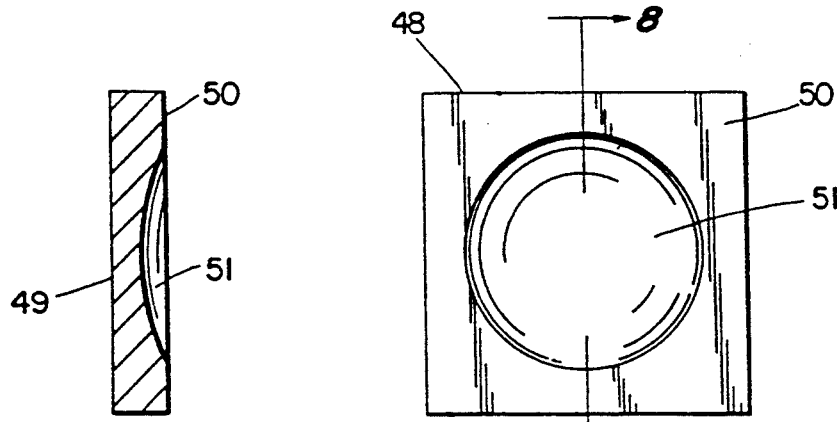
FIG. 7 is a front elevational view of a third embodiment of a pole piece.
FIG. 8 is a lateral sectional view taken along line 8—8 of the pole piece shown in FIG. 7.

FIGS. 7 and 8 show, respectively, a front elevational view and a side sectional view of a fourth preferred pole piece 48 having a planar rear wall 49, a front wall 50 and a shallow curved hollow 51 formed in front wall 50. As described hereinafter, hollow 51 may take the shape of a paraboloidal or exponentially-defined curve, or may be a complex curved surface constructed to maximize strength and uniformity of the magnetic field at selected locations within cavity 39.

Figure 13:
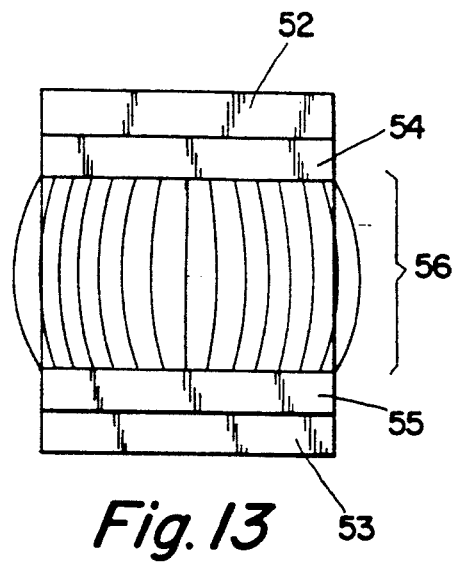
FIG. 13 is a schematic representation of lines of magnetic flux produced without the use of auxiliary magnets.

The various shapes and configurations of the pole pieces discussed above are intended to enhance the cooperation of auxiliary magnets (such as 23, 24, 25 and 26) with a principal magnet (such as 21) to provide a strong, uniform magnetic field within cavity 39. Although the reasons that such a magnetic field is produced are not fully understood, it is believed that use of auxiliary magnets surrounding the selected pole piece results in a stronger magnetic field at the edges of the pole piece than at its center. The effect of this increased field strength is to straighten the flux lines extending across cavity 39 and make the field more uniform closer to the center of cavity 39. As seen in FIG. 13, a typical pattern of flux lines extending between magnet assemblies demonstrates the tendency of the lines of flux to assume a non-linear configuration, i.e., to "bow" outward as the edges of the magnet are approached. Included in FIG. 13 are principal magnets 52 and 53 and corresponding pole pieces 54 and 55. Flux lines 56, although not drawn precisely to scale, illustrate the above-described tendency.

Investigations have determined the at the strength of the magnetic field produced across air gap 39 varies across the vertical distance between the midpoint of the air gap and each pole piece (herein characterized as the z-axis), and the distance from the midpoint of the air gap horizontally toward the outer periphery of the pole pieces.

The reference point R for such measurements, shown in FIG. 3, is the point midway between (a) the two pole pieces; (b) front panel 11 and rear panel 14; and (c) side panels 12 and 13. As seen in FIGS. 3 and 4, the axes of reference are drawn with the y-axis extending parallel to the two pole pieces, and perpendicular to side, panels 12 and 13, and the x-axis extending parallel to the two pole pieces, and perpendicular to front panel 11 and rear panel 14 and the z-axis extending perpendicular to the two pole pieces.

For the embodiment shown in FIG. 2, when magnetic field strength is measured in a plane containing the x-axis and y-axis, it has been found that the strength of the magnetic field tends to decrease from a maximum at reference point R in a generally curvilinear fashion. With respect to magnetic strength measured in a plane containing the x-and z-axis, it has been found that magnetic strength tends to increase when measured from reference point R along the z-axis toward each pole piece, with the increase following a generally curvilinear track.

Ideally, the change in magnetic strength measured from the reference point should be minimized throughout that portion of the field maintained within the test region, that is, the area within which the sample to be tested will be placed. An ideal magnetic field within a test region will exhibit uniform field strength and field direction, that is, the field strength and direction will be the same in all parts of the test region. Use of pole pieces with varying configurations, and other "fine-tuning" techniques to come closer to such ideal field characteristics will be discussed in more detail hereinbelow.

In the preferred embodiment being discussed, it is an object of the present invention to create a magnetic field for use in high resolution NMR spectroscopy. The degree of resolution is characterized as the capacity to create a magnetic field with a field gradient-to-field strength ratio adequate to sense the degree of energy change created by the application of NMR principles to a sample positioned within the magnetic field. The field strength is, of course, the magnitude of the magnetic force created by the magnet arrangements across the air gap between them. The field gradient is the change, over distance, of the field strength. In other words, with a field strength of 10,000 gauss, and a variation of 0.1 gauss across that region of the air gap used as the test zone, the ratio of field gradient to field strength may be expressed as 0.000001, or 1 part per million (PPM). To detect the difference between the spectra created by glucose and water, the field resolution would have to be 0.5 ppm. The economic challenge faced in creating a usable permanent magnetic field for NMR applications is the construction of a magnet arrangement which depends upon relatively light-weight permanent magnets, precisely machined and/or shaped rather than huge permanent or electromagnets requiring a tremendous mass to create the magnetic field required for such testing.

For the embodiment shown in FIGS. 1-3, as described hereinabove, a magnetic field strength of 10,000 gauss and a resolution of 10-18 ppm has been achieved.

It should be understood that the term "flux lines" represents the direction, and uniformity of the flux field. The pattern of the flux field may be described, for example, by the tendency of small ferromagnetic particles such as iron filings to arrange themselves along the paths of magnetic force, i.e., the flux lines. The uniformity of the magnetic field may generally be described as the density of the flux lines in a topographical sense. Each flux line represents an increment of field strength. The space between adjacent flux lines is an area of uniform field strength. Thus, where the flux lines are closer together the field gradient is greater, i.e., the field is less uniform over a given distance. Where the flux lines are farther apart, the field is more uniform over a given distance Referring to FIG. 13, it should be understood that the power and usefulness of the magnet arrangement shown therein is dependent upon the relative sizes of the magnets and pole pieces. For example, it would be theoretically possible to use magnets and pole pieces several feet in length, with the end goal being the creation of a test region somewhere about the mid-point of such a construction which would be of sufficient field strength and uniformity to be useful in NMR diagnostic applications. The challenge to creating a useful magnet arrangement comes when finite limits to the size of such magnets are established in order to manufacture apparatus which is portable and convenient to use.

Figure 14:
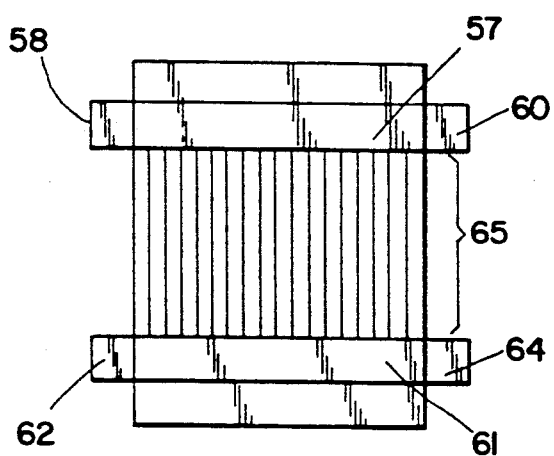
FIG. 14 shows the arrangement of FIG. 13 with the auxiliary magnets in place.

FIG. 14 provides a schematic representation of the variation shown in the directions of the lines of magnetic flux with the addition of four auxiliary magnets surrounding pole piece 54 of FIG. 13, only three such auxiliary magnets being shown at 57, 58 and 60 in FIG. 14. Four auxiliary magnets also surround pole piece 55 of FIG. 13, only three such auxiliary magnets being shown at 61, 62 and 64 in FIG. 14. The resulting lines of magnetic flux indicated schematically at 65 are straighter, and present a more uniform magnetic field throughout the centermost portion of air gap 39.

It should be noted that spacers 37 and 38 have been omitted from FIGS. 13 and 14 for purposes of clarity.

It should also be understood that the flux lines shown in FIG. 13 and 14 extend throughout cavity 39 (and, thereby, the test region) in a three-dimensional array.

As best seen in FIGS. 1 and 2, apertures 17 and 18 are provided to enable the insertion therethrough of a test sample. As an example, for use with NMR diagnostic devices, the "test sample" would be a body member, preferably a finger, positioned within the magnetic field created by the magnet arrangements described hereinabove.

Although only one aperture such as 17 or 18 is actually required, it is thought that a pair of opposed apertures may assure that the magnetic field created by the magnet arrangements disposed within chamber 10 is as uniformly distributed as possible by making chamber 10 as symmetric as possible.

In order to assure accurate and reproducible test results, the magnetic field created within test chamber 10 should be as uniform as possible within the test region, that is, the space to which aperture 17 communicates and within which the test sample is placed. In this context, "uniform" means that the lines of flux extending across the air gap between the opposed magnet arrangements will be widely spaced and will be constant to as great a degree as possible with respect to the test region within test chamber 10 occupied by the inserted test sample.

Figure 9:
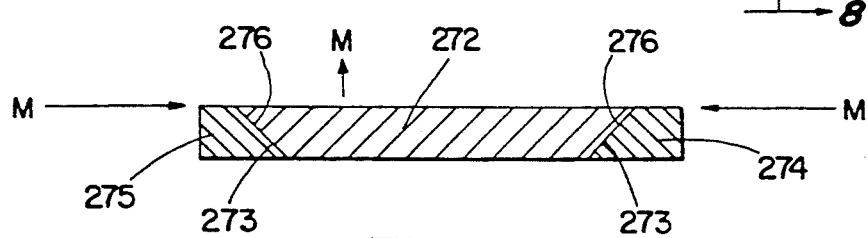
FIG. 9 is a cross-sectional view showing a second arrangement of auxiliary magnets surrounding a pole piece.

Referring now to FIG. 9, there is shown a cross-sectional view of an alternate preferred embodiment of an auxiliary magnet/pole piece arrangement. Pole piece 272 is formed as a square having beveled edges exemplified at 273. The direction of the magnetic field is shown in FIG. 9 in and the letter designation M. Auxiliary magnets 274 and 275 are formed with beveled edges 276 to mate closely with edges 273 of pole piece 272. It is expected that this arrangement will result in a "straightening" effect on the lines of magnetic flux as they near the outer edges of pole piece 272.

While the reason for this effect is not yet fully understood, it is known that lines of magnetic flux at a steel/air interface leave the magnetized steel normal (perpendicular) to the steel surface. The lines of magnetic flux emanating from pole piece 272 exhibit a tendency to leave normal to the surface of pole piece 272. It is believed that the beveling of the mating edges of the respective auxiliary magnets and pole piece present a less abrupt and more gradual realignment of the lines of magnetic flux traveling from, for example, auxiliary magnet 274 to pole piece 272 and thence outwardly across the air gap 39 within chamber 10. In other words, where pole piece 272 is non-beveled, the magnetic flux in question must go through a complete 90 degree turn to exit normal to the face of pole piece 272.

In the example shown in FIG. 9, the lines of flux entering pole piece 272 from auxiliary magnet 274 need be turned through only a 45 degree angle in order to exit at right angles from pole piece 272. It is believed that this more gradual, step-wise alignment of magnetic flux results in an enhanced array of flux lines which are straighter and less distorted. The angles of inclination for edges 273 and 276 are preferably complementary, i.e., totaling 90 degrees, to allow the front faces of pole piece 272 and auxiliary magnet 274 and 275 to be coplanar.

In the other selected embodiments of pole pieces shown in FIGS. 4, 5, 6, 7 and 8, the tendency of the outermost lines of flux to "bow" outwardly is counteracted by changing the surface configuration of the pole piece in question. For example, it is theorized that the lines of flux leaving pole piece 40 will do so normal to the curve of hollow 43. Thus, the outermost lines of flux will be angled inwardly in an attempt to counter the tendency of said lines of flux to bow outwardly at the edges of pole piece 40. Within this context, "normal" would be described as an outwardly extending line perpendicular to a tangent drawn to the surface of hollow 43 at any given point.

The configuration of hollow 51 may be a regular geometric shape, or may be dictated by a computer-performed analysis of the characteristics of each such magnet arrangement and the factors that will affect the direction and strength of the resulting magnetic field. While the results of this analysis have not yet been fully characterized, it has been learned that the uniformity of the magnetic field produced within the test region is enhanced when the outermost portions of a selected pole piece are closer than the, central portion of the pole piece to a plane parallel to the two pole pieces and bisecting air gap 39. The precise shape of a pole piece to maximize the strength and uniformity of the magnetic field throughout the test zone may consist of a regular geometric shape or may consist of a complex curve or set of curves.

Figures 10, 11:
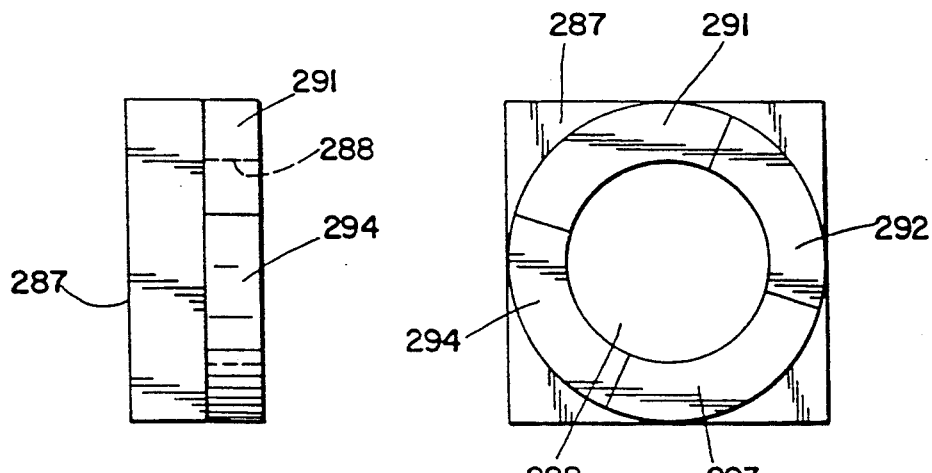
FIG. 10 is a side elevational view of a magnet arrangement utilizing a circular pole piece and curved, auxiliary magnet segments.
FIG. 11 is a front elevational view of the arrangement shown in FIG. 10.
Figure 12:
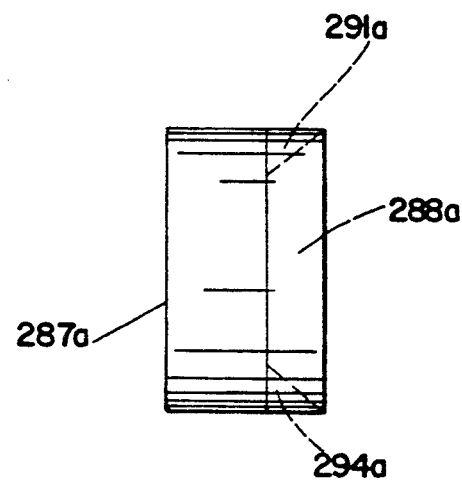
FIG. 12 is a side view of a second version of the magnet arrangement shown in FIGS. 10 and 11.

Other embodiments of pole piece/auxiliary magnet arrangements are demonstrated in FIGS. 10, 11 and 12. In FIGS. 10 and 11, principal magnet 287 is formed as a square while pole piece 288 is formed as a solid cylinder, with one of the circular faces placed against principal magnet 287 and with the remaining, opposed facing outwardly. Auxiliary magnets 291, 292, 293 and 294 are shown in FIG. 11 as toroidal segments forming a ring having a square or rectangular cross section and fitting completely about the outer periphery of pole piece 288. Such an arrangement avoids the gaps shown in FIG. 3 where auxiliary magnets 23, 24, 25 and 26 terminate. Again, it is theorized that the arrangement shown in FIGS. 10 and 11 produces a more efficient uniform magnetic field by reason of the total peripheral contact of auxiliary magnets 291, 292, 293 and 294 with pole piece 288.

As shown in FIG. 12, it is also anticipated that the periphery of pole piece 288a that cooperates with principal magnet 288 and the periphery of auxiliary magnet segments 291a through 294a, only two of which are shown at 291a and 294a in FIG. 12, may be beveled to achieve the "straightening" effect discussed hereinabove in connection with FIG. 9. It is also to be understood that although four auxiliary magnet segments are illustrated in FIGS. 10 and 11, any number of such segments may be used as required. One such construction actually assembled and tested utilized 16 uniformly sized and shaped segments surrounding a circular pole piece.

Figure 15:
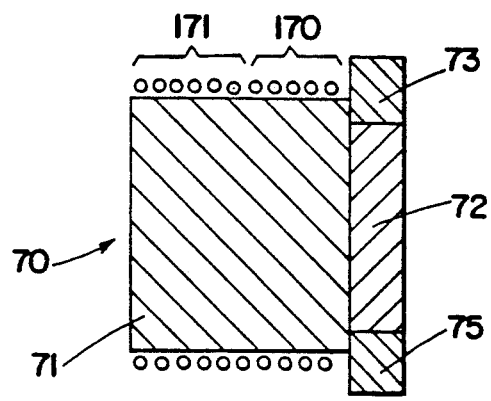
FIG. 15 is a side sectional view of a magnet assembly having a cylindrical main magnet, a cylindrical pole piece and toroidal auxiliary magnet segments.
Figure 16:
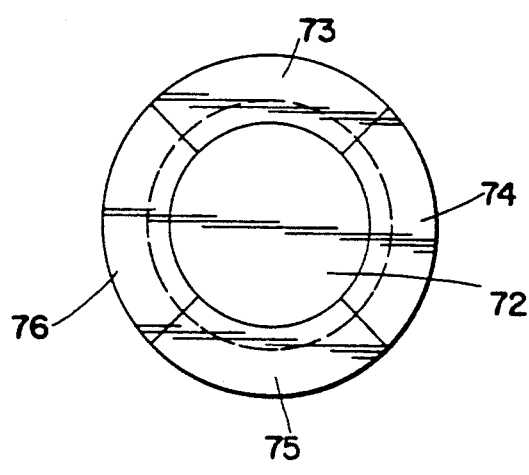
FIG. 16 is a front view of the assembly of FIG. 15.

Referring now to FIGS. 15, 16, 17 and 18, there is shown therein yet another embodiment of the magnet assemblies and test chamber. FIGS. 15 and 16 show, in lateral section, and in front elevation a magnet assembly 70 comprising a cylindrical principal magnet 71, a cylindrical pole piece 72 and toroidal auxiliary magnet segments 73, 74, 75 and 76 arranged in edgewise contact to pole piece 72. A second magnet assembly 80, comprising principal magnet 81, pole piece 82, and auxiliary magnets 83, 84, 85 and 86 is shown in FIG. 17. As also shown in FIG. 17, magnet assemblies 70 and 80 are disposed within a cylindrical housing 90 having end caps 91 and 92 closing off a main cylindrical body 93. Aperture 94 is provided in body 93 as a means to insert a test sample within the test region formed between the magnet assemblies 70 and 80.

It is believed that forming body 93 as a cylinder and forming principal magnets 71 and 81, pole pieces 72 and 82 and auxiliary magnets 73, 74, 75, 76 and 83, 84, 85 and 86 as, respectively, cylindrical segments and curvilinear toroidal segments will minimize the deviations and variations in field strength and direction encountered when abrupt changes in shape occur.

Referring now to FIG. 18, there is depicted a spacer 87, and a core 100, to be described more fully hereinbelow.

Spacer 87 is a rigid, non-ferromagnetic toroidal element intended to be inserted between magnet assemblies 70 and 80 to keep them separated and to maintain an air gap between them. Spacer 87 may be made from brass or aluminum Referring now to FIGS. 18, 19, 20, 21 and 22, there is shown therein, a core 100, manufactured from rigid, non-ferromagnetic material and shaped, configured and dimensioned to fit closely within spacer 87, positioned between the magnet assemblies used in the present invention. For purposes of convenience, the placement and function of core 100 will be described with respect to the embodiment of FIG. 17. Thus, core 100 is placed within spacer 87 and between pole pieces 72 and 82.

Figure 22:
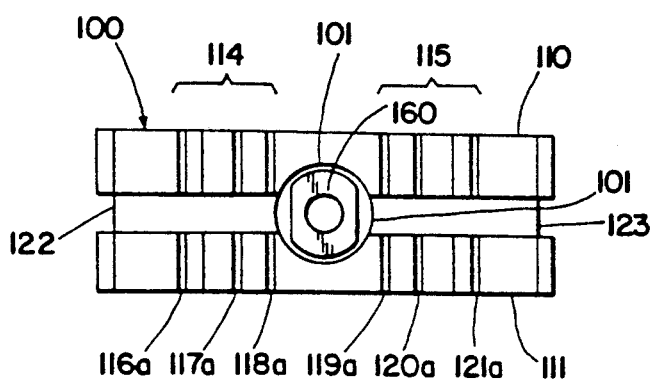
FIG. 22 is a second lateral view of the core of FIG. 19.

As best seen in FIGS. 19 and 22, core 100 includes a core aperture 101 extending diametrically through core 100 . and positioned to register and align with test aperture 94, shown in FIG. 17. Thus, when a sample to be tested is inserted into the test region within housing 90 via test aperture 94, it will be positioned within core aperture 100.

The function to be served by core 100 is the shaping and positioning of shim coils to be used in fine-tuning or aligning that portion of the magnetic field extending throughout the test region within which the sample to be tested is placed. The use of shim coils on either side of a test region seated between permanent magnets is well-known and is described in the article entitled "Electrical Current Shims for Correcting Magnetic Fields", written by Weston A. Anderson and appearing in *The Review of Scientific Instruments*, Volume 32, Number 3, at pp. 241-250.

Core 100 has a pair of opposed faces 110 and 111, and a series of grooves milled on the faces and lateral edges thereof to accomodate lengths of electrical wire used to produce electromagnetic forces of selected strength and direction when electrical current is passed through the wires.

Figure 20:
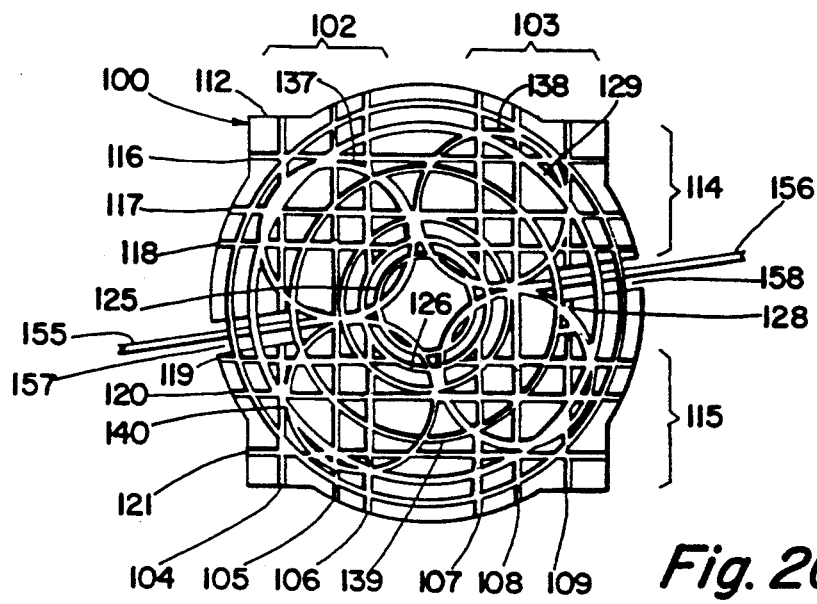
FIG. 20 is a front view of the core of FIG. 19 with shim coils in place.

As best seen in FIGS. 19 and 20, certain of the grooves are linear while others are formed in circular patterns. As best seen in FIG. 20, the circular grooves are formed in two clusters, one a series of concentric circles, and the other a series of identically sized, individual circles whose centers are equidistantly spaced along an imaginary circle drawn on the faces 110 and 111 of core 100. The particular shapes, positioning and dimensions of the grooves in question will be discussed in greater detail hereinbelow In analyzing the magnetic field produced by magnet assemblies 70 and 80, it has been found that the non-uniform behavior of the magnetic field may be characterized as having first order, second order, third order and fourth order mathematically-expressible vectors or components. The orientation and alignment of the magnetic field must be evaluated and described in 3-dimensional terms as the field exists in the space between pole pieces 72 and 82. The corrections hereinafter discussed are made with the understanding that the magnetic field strength and direction at any given point may be expressed as a vector having X, Y and Z components.

The first order component has been found to be a generally linear one, the second order component may be expressed as a parabolic function, the third degree component comprises a generally exponential function, while the fourth degree component is much more complex and is believed to be the result of a combination of the deviations noted at the first-second-and third-degree levels.

It is believed that a contributing factor to these deviations from uniformity is the reflection of a portion of the magnetic field by the steel pole pieces utilized in magnet assemblies 70 and 80.

The magnetic field created between magnet assemblies 70 and 80 is characterized in three dimensions, as generally shown in FIGS. 2 and 3 with the X and Y axes extending perpendicular to each other and parallel to the faces of the pole pieces, while the Z axis extends perpendicularly to and between the pole pieces. For the purpose of discussing the use of core 100 and the associated shim coils in the embodiment shown in FIG. 17, we will assume that the mid-point or reference point ($X=0$, $Y=0$, $Z=0$) is located along the axis of cylinder 90 and midway between pole pieces 72 and 82. The X axis will be assumed to extend along the axis arbitrarily drawn through and centered within aperture 94, the Y axis is perpendicular to the X axis and extending parallel to the faces of pole pieces 72 and 82, and the Z axis extends along a portion of the axis of cylinder 90 between pole pieces 72 and 82.

Figure 21:
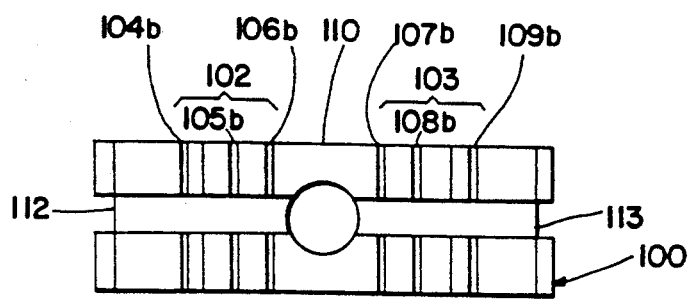
FIG. 21 is a first lateral view of the core of FIG. 19.

It has been found that the use of shim coils formed in a rectangular configuration will correct the magnetic field with respect to the uniformity of the field. Referring now to FIGS. 20 through 22, the rectangular shim coils in question are formed by wrapping turns of insulated, electrically-conductive wire within the linear grooves formed on and about core 100. Preferably, the shim coil windings use thin, insulated lengths of wire of the order of 0.008 inches in diameter. Such windings offer a number of advantages in that the total mass available for the use of electromagnetic energy may be selected and adjusted by varying the number of turns of wire used. Such a technique will also limit the effect of spurious electromagnetic fields created by the wires themselves as the wire leads enter and exit chamber 90. Smaller diameter wires will produce smaller such spurious fields.

For purposes of reference only, the grooves shown as extending upward and downward in FIG. 20, will be identified as vertical grooves, while the grooves extending left to right will be characterized as horizontal grooves.

Referring now to FIG. 20, there is shown a first group 102 of vertical grooves comprising three parallel grooves and a second group 103 of three parallel vertical grooves extending across face 110 of core 100. It should be understood, at this point, that the obverse face 111 of core 100 has formed thereon identically sized shaped and dimensioned vertical grooves.

For purposes of identification, those segments of the grooves appearing on face 110 of core 100 will be referred to as groove segments, 104a, 105a and 106a, 107a, 108a and 109a, while the corresponding groove segments on obverse face 111 of core 100 will be referred to, correspondingly, as 104c, 105c, 106c, 107c, 108c and 109c.

Referring now to FIG. 21, it may be seen that each group of vertical grooves 102 and 103 includes groove segments extending along the lateral edge 112 of core 100. These groove segments will be identified, respectively, as segments, 104b, 105b, 106b, 107b, 108b and 109b. It should also be understood that the opposed lateral edge 113 of core 100 has formed thereon correspondingly sized and shaped groove segments which will be identified as segments 104d, 105d, 106d, 107d, 108d and 109d.

A single rectangular shim coil 104 is formed by winding insulated, electrically conductive wire within groove segments 104a, 104b, 104c and 104d to extend about the entire periphery of core 100. As seen in FIG. 20, the shim coils formed by groups 102 and 103 surround aperture 101 and, thereby, the test region. Similarly formed coils 105, 106, 107, 108, and 109 are formed by windings within the remaining vertical grooves.

In similar fashion, groups 114 and 115 of horizontally extending grooves as shown in FIG. 20 will contain coils 116, 117, 118, 119, 120 and 121 formed by placing windings in groove segments, 116a-d, 117a-d, 118a-d, 119a-d, 120a-d and 121a-d corresponding to the description hereinabove of the vertically extending grooves. Coils 116, 117, 118, 119, 120 and 121 will thus extend about the entire periphery of core 100, across face 110, lateral edge 122, obverse face 112 and lateral edge 123.

Groove groupings 102 and 103 intersect with groupings 114 and 115 along face 110 and obverse face 111. In order to obtain as uniform a wrapping as possible, one set of grooves will be deeper than the intersecting set of grooves so that the windings within one set of grooves will not touch the corresponding windings at the points of intersection.

Referring to FIG. 18, there is shown on face 110 two groupings of circular grooves. The first grouping is a series of concentric, or "on-axis" circles formed about center 124 of face 110. For purposes of reference, it should be noted that the Z axis passes through center 124 when core 100 is properly positioned within body 93.

In similar fashion to that described hereinabove, the on-axis shim coils 125, 126, 127, 128, 129 and 130, shown in FIG. 20 are formed by wire windings laid within on-axis circular grooves, 125a, 126a, 127a, 128a, 129a and 130a, shown in FIG. 18. Corresponding shim coils 131, 132, 133, 134, 135 and 136 are formed on obverse face 111 within grooves 131a, 132a, 133a, 134a, 135a and 136a (not herein specifically shown). In the present embodiment, shim coils 125, 131 are identical in size and are positioned in fixed, parallel spaced relationship, as are coil pairs 126, 132; 127, 133; 128, 134; 129, 135; and 130, 136. It has been found that when corresponding on-axis coils such as that described hereinabove are energized by passing electrical current therethrough, field uniformity in the Z direction is adjusted and enhanced.

A second group of circular shim coils (the "off-axis" shim coils) 137, 138, 139 and 140, as seen in FIG. 20, is formed by windings located within spaced circular grooves 137a, 138a, 139a and 140a shown, in FIG. 18, as spaced equidistantly about face 110 with the centers of said circles equidistant from center 124 of core 100. Corresponding off-axis coils 141, 142, 143 and 144 (not herein shown) are formed on obverse face 112 and 144a (not herein shown). It has been found that the spaced circular shim coils can be used to adjust and correct the uniformity of the magnetic field about the Z axis.

FIG. 18 shows core 100 assembled within spacer 87, with the windings forming surrounding, on-axis and off-axis shim coils in place. As seen in FIGS. 19 and 20, core 100 has "ears" 145 formed thereon, while spacer 87 has slots 146 milled therein to register with and receive ears 145 to prevent rotation of core 100 within spacer 87.

Spacer 87 also includes an annular groove 147 formed on face 148, with a corresponding annular groove 149 formed on obverse face 150 (not herein specifically shown). An additional on-axis shim coil 151 may be wound onto insert 152, with a corresponding on-axis shim coil 153 formed onto insert 154 on obverse spacer face 150. Additional such grooves and coils may be added as deemed necessary.

The windings forming the above-described shim coils terminate at, and are gathered by lead-out cables 155 and 156 respectively. Lead-out cable 155 is seated within radial channel 157 while lead-out cables 156 is seated within radial channel 158.

In a preferred embodiment, selected shim coils or groups of shim coils are connected to separately controlled dc power supplies and are separately adjustable to control the characteristics of the permanent magnetic field.

As an example, corresponding shim coils 104 and 107 are controlled by a single power supply to correct the field for uniformity along the y-axis while shim coils 118, 119 are separately controlled to perform a similar correction along the x-axis. Shim coils 104, 105, 108 and 109 are controlled by a single power supply to correct second order non-uniformity along the y-axis, with coils 116, 117, 120, 121 making similar corrections along the x-axis.

On-axis coils 127 and 133 are controlled by a single power supply, as are on-axis grouping 133, 128, 131, 134; grouping 126, 130, 132, 136; and grouping 129, 135, 148, 150. The spacing, diameter and number of wire turns of these on-axis coils have been selected to correct the magnetic field aberrations described hereinabove, with group 127, 133 correcting the first order, or linear gradient; group 125, 128, 131, 134 correcting the third order, or exponential gradient; group 126, 130, 132, 136 correcting the second order, or parabolic gradient; and group 129, 135, 148, 150 correcting the fourth order gradient.

Off-axis coils 137, 139, 141, 143 are separately controlled, as are coils 138, 140, 142, 144. The off-axis coils correct that portion of the magnetic field vectors which extend along the x-axis and y-axis.

The size, shape, spacing and current flow through the above-described shim coils are determined by computer simulation of the magnetic field, anticipated required corrections and experimentation. Varying current flow can be accomplished by varying the number of turns of wire forming selected shim coils as well as the electrical energy passing through the coils. With respect to the on-axis and off-axis coils, corresponding coils in parallel, face-to-face relationship across air gap 39 are preferably simultaneously adjusted and are identically sized, shaped and wound.

It has been found that use of the shim coils as described hereinabove has increased the resolution of the resulting magnetic field to about 0.5 ppm, a factor of between twenty and one hundred compared to achieved unshimmed results.

The pole pieces and magnets to be used in connection with the present invention may be machined to produce precisely shaped and configured pieces. Alternatively, the pieces may be molded, using powdered metal, to produce highly-toleranced and uniformly made parts. One material believed to be satisfactory for the manufacture of the principal magnets is known as neodymium 35, although the operation of the present invention is not deemed to be dependent upon the particular magnetic material.

It is anticipated that the accuracy and efficiency of the proposed invention may be heightened by the use of secondary auxiliary permanent magnets disposed within test chamber 10 proximate to the selected auxiliary magnets surrounding each selected pole piece. The placement of such secondary auxiliary magnets is shown schematically in FIG. 2 at 63. The positioning and strength of such secondary auxiliary magnets may be adjusted experimentally in order to produce an optimally uniform magnetic field, particularly across that portion of the field penetrated by the insertion of the test subject through aperture 17.

The techniques or embodiments shown in FIGS. 4 through 9 may be combined, with pole pieces and auxiliary magnets having beveled edges and with pole pieces having surface hollows, holes, depressions, projections or other configurations formed therein or thereon, as disclosed hereinabove.

In performing nuclear magnetic resonance testing, it has been found that the accuracy and reproducibility of the results of such testing are enhanced when the test sample is rotated or spun with respect to the permanent magnetic field. Spinning exposes the molecules in the test sample to an average of the magnetic field strength, cancelling some of the effects caused by variations in field uniformity. Physical spinning may be easily performed where the test sample is, for example, a test tube or other storage vessel placed within the test region of the particular NMR device. However, spinning or rotating the test sample is impossible where the sample is a body extremity as, for example, a finger.

It has been discovered that the same effect accomplished by physically spinning the test sample may be realized by modulating the electrical current passing through the shim coils described hereinabove. When used to align and adjust the magnetic field, the shim coils are supplied with dc electrical current. It has been found that the spinning effect may be created by modulating a portion of the electrical current as it passes through the shim coils. It is believed that the modulation causes a shift or movement of the field thus producing "spinning" in that although the sample is stationary, a portion of the electromagnetic field produced by the shim coils is moving with relation thereto Another technique to be used for producing more accurate NMR results involves the use of ultrasonic energy introduced into the test sample to induce more random motion to the molecules within the sample. It is believed that random motion of the molecules more uniformly exposes the molecules to the full force of both the aligning and exciting fields and makes possible more reproducible results with respect to detecting and interpreting the change in energy level when the exciting field is collapsed.

As seen in FIG. 22, an ultrasonic transducer 160 is positioned within aperture 101 of block 100 at the lowermost portion thereof. A test sample, contained in a vessel such as a test tube, would, when inserted, into aperture 101, come into contact with transducer 160 and when energized, transducer 161 would transmit ultrasonic energy to the sample contained in the test vessel.

The NMR techniques described hereinabove are also applicable to detection of electron spin resonance in a test sample. Using the technique of electron spin resonance, electrons in the test sample are resonated rather than protons. This requires higher frequencies of exciting energy due to the much smaller mass of the electron and the electrons much higher mobility. Until the use of the present invention, prior art spin resonance equipment called for water-cooled magnets on the order of 6,000 pounds.

Referring now to FIG. 15, the numeral 170 indicates generally a series of resistance-type heating elements wrapped about principal magnet 71. It has been found that the magnetic field strength created by permanent magnets such as principal magnet 71 is affected by changes in ambient temperature. Generally, as the temperature decreases, the magnetic field strength increases. : Accordingly, heater wires 170 are provided as a means for thermostatically adjusting and maintaining the temperature of principal magnet 71 within a selected temperature range. Such adjustment may be made manually, or may be controlled by a thermostatic device which senses changes in the ambient temperature. It should be understood that thermostatic control also extends to cooling principal magnet 71 to a desired temperature as well. Cooling coils (not herein specifically shown) may also be used, as well as coils to carry a heating or cooling liquid or gas.

Another factor which affects the operating characteristics of magnet assemblies such as 70 is the tendency of certain ferromagnetic materials to become saturated when exposed to magnetic energy. Saturation, within the context of the present invention, means a tendency for the pole piece to limit the passage of magnetic flux therethrough. It has been found that and 76 becomes peripherally saturated, with flux forced to the unsaturated, central portion of the pole piece as those portions of the pole piece in contact with the auxiliary magnets become saturated. The saturation characteristics of selected pole pieces may be utilized as a limit under certain circumstances. For example, should a magnet assembly be intended for use out of doors, the material used for the pole piece can limit the magnet's increase in strength due to low ambient temperatures by choosing a material which becomes saturated at a selected temperature, limiting the magnet's strength at temperatures below the selected temperatures. Saturation data and saturation curves for various ferromagnetic materials are well-known in the art and may be utilized in selecting pole pieces for individual applications.

Referring now to FIG. 15, a set of modulating coils 171 is shown wrapped about principal magnet 71. The purpose for the modulating coils is to adjust the magnetic field strength within air gap 39 by an amount equal to several gauss. Although this shift in field strength is relatively small when compared to the overall field strength, it will make it possible to move a test sample in and out of resonance when used in connection with NMR analysis. The shift in and out of resonance will be useful in slightly shifting the peak or the location of the resonant peak in order to or accurately analyze the test sample.

Referring now to FIG. 15, it has been found advantageous to make pole piece 72 smaller in diameter than principal magnet 71 such that principal magnet 71 overlaps the outermost edges of pole piece 72. It is believed that such a construction avoids the magnetic field aberrations which occur when a ferromagnetic piece and a magnet meet along an interface exposed to the air. For example, if pole piece 72 and principal magnet 71 were of equal diameter, an interface would exist at the point where the rearmost face of pole piece 72 and the frontmost face of magnet 71 meet at their peripheries. This situation is avoided by the selection of the diameter sizes shown in FIG. 15.

Although the auxiliary magnets shown, for example, in FIGS. 15 and 16 are formed as discrete segments, it is also contemplated that a single casting may be manufactured which would eliminate any interface between the pole piece and the auxiliary magnets. The techniques for forming such a casting, even of disparate materials, and selectively magnetizing portions of the casting are well-known and could be readily employed within the teachings of the present invention. It is also contemplated that a single casting which includes not only the pole piece and auxiliary magnets but the principal magnet as well may also be manufactured.

Assembly of the test apparatus shown in FIG. 1 may be described as follows. Principal magnet 31 is positioned on bottom panel 16, and pole piece 32 is positioned atop principal magnet 31. Next, spacers 36 and 37 are stacked and held atop pole piece 32. Pole piece 22 is then stacked atop spacers 36 and 37, followed by principal magnet 21 and top panel 15. Auxiliary side magnets 33 and 35 are next positioned along opposed edges of pole piece 32: in like fashion auxiliary side magnets 23 and 25 are positioned along the corresponding edges of pole piece 21. Auxiliary magnets 24, 26 and 34, 36 are next assembled to pole pieces 21 and 31. Top panel 15, and side panels 11, 12, 13 and 14 are then attached, completing assembly. Where shim coils are used, spacers 37 and 38 carry case 100 with the required shim coils assembled thereto.

In an alternate embodiment, said auxiliary magnets would be placed directly about the periphery of principal magnet 21. For such an arrangement, principal magnet 21 would have to be free from manufacturing flaws which create field discontiniuties or "hot spots" which may be corrected by the use of a pole piece.

It is also anticipated that machining or shaping the face of principal magnet 21 as described hereinabove with respect to pole piece 22 will produce field-adjusting enhancing effects as described hereinabove. To construct a test chamber such as that shown in FIG. 1, a pair of such alternate groupings, consisting of a principal magnet surrounded by auxiliary magnets may be used in the same fashion as described hereinabove.

In the preferred embodiment shown in FIG. 17, assembly may be made as follows. Principal magnet 71 is positioned on end cap 91. Pole piece 72 is then placed upon principal magnet 71 and auxiliary magnets 73, 74, 75 and 76 are then placed about the periphery of pole piece 72. Completed magnet assembly 70, together with end cap 91 is inserted into one end of body 93 and secured.

Core 100 with the shim coils selected for use is next inserted into spacer 87, and the core/spacer assembly is inserted from the remaining open end of body 93 and positioned within body 93 to align test aperture 94 with core aperture 101.

Next, magnet assembly 80 is assembled to end cap 92 as hereinbefore described with respect to magnet assembly 70 and end cap 91. Completed assembly 80 and end cap 92 are then inserted to close off chamber 93 and complete assembly of test chamber 90.

Figure 23:
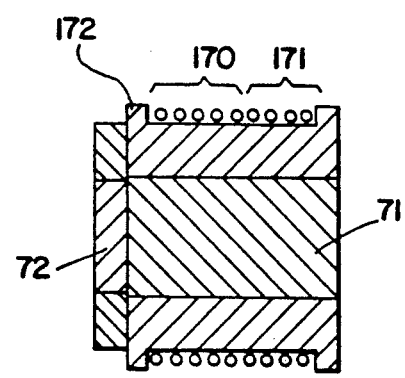
FIG. 23 is a sectional view of the principal magnet of FIG. 15 and a spool-type holder therefor.

As seen in FIG. 23, a variation of the foregoing assembly would include a non-ferromagnetic spool 172 onto which modulating coils 171 and/or heater coils 170 may be wound. Principal magnet 71 would be inserted within spool 172 and, thereafter, inserted into body 93. It desirable that spool 172 be machined to close tolerances to perform the additional function of aligning principal magnet 71 within body 93 to assure that the axis of principal magnet 71 and body 93 coincide.

The embodiments discussed hereinabove are concerned with the somewhat stringent requirements for magnetic fields used in NMR spectroscopic analysis. The present invention may be equally applied to circumstances requiring less stringently controlled magnetic fields by omitting, for example, pole pieces, shim coils, modulating coils, thermostatic controls, and other "fine-tuning" expedients discussed herein. The teachings of the present invention may readily be adapted to the particular circumstances and requirements of each such use.

While the foregoing has described the present invention with respect to certain preferred embodiments thereof, it is anticipated that others will perceive variations which, while differing from the foregoing, do not depart from the spirit and scope of the invention as herein described and claimed, and no limitations as to the scope of the present invention are herewith intended.

What is claimed is:

1. Apparatus for providing a magnetic field across a gap and including a ferromagnetic housing enclosing a pair of opposed permanent magnet assemblies having magnetic poles of opposite magnetic polarity facing one another across a gap, each said permanent magnet assembly including a spool of non-ferromagnetic material having a spool opening therethrough and a permanent magnet closely received in said spool opening, and said spool in each of said permanent magnet assemblies being closely received in said ferromagnetic housing.

2. The apparatus of claim 1 wherein said spool and said permanent magnet in each of said permanent magnet assemblies have opposite ends that are substantially flush with one another.

3. The apparatus of claim 1 wherein said spool in each of said permanent magnet assemblies has opposite spool ends and outer spool periphery, a circumferential spool recess in said spool periphery intermediate said opposite spool ends, said recess providing an internal space between said spool and said ferromagnetic housing.

4. The apparatus of claim 3 including temperature adjusting means positioned around said spool in said spool recess for adjusting the temperature of said permanent magnet received in said spool by transfer of heat between said temperature adjusting means and said permanent magnet through said spool.

5. The assembly of claim 4 wherein said temperature adjusting means comprises an electrical resistance heater coil.

6. The assembly of claim 4 wherein said temperature adjusting means comprises a tubular coil through which heat transfer fluid flows.

7. The apparatus of claim 1 wherein said permanent magnets in said permanent magnet assemblies have facing ends that face toward one another, a ferromagnetic pole piece positioned against each said facing end, each said pole piece being smaller than and outwardly overlapped by said facing end against which it is positioned, and auxiliary permanent magnet means for enhancing the uniformity of said magnetic field across said gap, said auxiliary permanent magnet means peripherally surrounding each said pole piece and extending outwardly beyond each said facing end of said permanent magnets.

8. The apparatus of claim 1 wherein each said permanent magnet assembly includes a ferromagnetic pole piece surrounded by auxiliary permanent magnet means for enhancing the uniformity of said magnetic field across said gap, said pole piece and said auxiliary permanent magnet means being a single integral casting.

9. The apparatus of claim 1 wherein said permanent magnet assemblies are on opposite sides of a gap defining a test zone in which test samples are positionable, and means for imparting ultrasonic energy to a test sample positioned in said test zone.

10. The apparatus of claim 1 wherein said permanent magnet assemblies are on opposite sides of a gap in which a test zone is defined, shim coils in said gap around said test zone for enhancing the strength and uniformity of the magnetic field in said test zone, and means for rotating at least part of the magnetic field produced by said shim coils relative to a test sample positioned in said test zone.

11. The apparatus of claim 1 wherein each said permanent magnet assembly includes a ferromagnetic pole piece peripherally surrounded by auxiliary permanent magnet means for enhancing the uniformity of said magnetic field across said gap, each said pole piece being of a material that becomes magnetically saturated at a predetermined temperature in relation to the magnetic strength of its associated permanent magnet and auxiliary permanent magnet means.

12. A magnet assembly comprising: a spool of non-ferromagnetic material having opposite ends, an outer periphery, and a circumferential recess in said outer periphery intermediate said opposite ends, said spool having an opening therethrough that opens outwardly at said opposite ends, and a permanent magnet closely received in said opening.

13. The assembly of claim 12 including temperature adjusting means received in said recess in said spool for adjusting the temperature of said permanent magnet by transfer of heat between said temperature adjusting means and said permanent magnet.

14. The assembly of claim 13 wherein said temperature adjusting means comprises a coil.

15. A magnet assembly comprising: a spool of non-ferromagnetic material having an opening therethrough closely receiving a permanent magnet, a housing of ferromagnetic material closely receiving said spool, and temperature adjusting means around said spool between said spool and said housing for adjusting the temperature of said permanent magnet by transfer of heat between said temperature adjusting means and said permanent magnet.

* * * * *